(12) United States Patent
Yue et al.

(10) Patent No.: US 10,286,607 B1
(45) Date of Patent: May 14, 2019

(54) PLASTIC LASER WELDING WITH PARTIAL MASKING

(71) Applicant: Microvision, Inc., Redmond, WA (US)

(72) Inventors: Naili Yue, Redmond, WA (US);
Thomas Byeman, Redmond, WA (US);
Sumit Sharma, Seattle, WA (US);
Nara Va, Bothell, WA (US)

(73) Assignee: Microvision, Inc., Redmond, WA (US)

( * ) Notice: Subject to any disclaimer, the term of this patent is extended or adjusted under 35 U.S.C. 154(b) by 0 days.

(21) Appl. No.: 15/846,701

(22) Filed: Dec. 19, 2017

(51) Int. Cl.
*B29C 65/16* (2006.01)
*B29C 65/14* (2006.01)

(52) U.S. Cl.
CPC .......... *B29C 65/16* (2013.01); *B29C 65/1496* (2013.01)

(58) Field of Classification Search
CPC ............................ B29C 65/16; B29C 65/1496
See application file for complete search history.

(56) References Cited

U.S. PATENT DOCUMENTS

| | | | |
|---|---|---|---|
| 6,465,757 B1 * | 10/2002 | Chen | B29C 65/1635 219/121.6 |
| 8,305,672 B2 | 11/2012 | Luanava et al. | |
| 9,223,129 B2 | 12/2015 | Brown et al. | |
| 2003/0098295 A1 * | 5/2003 | Kawamoto | B23K 26/0608 219/121.66 |
| 2006/0175004 A1 * | 8/2006 | Kurosaki | B29C 66/919 156/272.8 |
| 2006/0278617 A1 | 12/2006 | Anantharaman et al. | |
| 2009/0291244 A1 | 11/2009 | Kihara et al. | |
| 2017/0069555 A1 | 3/2017 | Milaninia | |
| 2017/0157838 A1 | 6/2017 | Thompson et al. | |

FOREIGN PATENT DOCUMENTS

| | | |
|---|---|---|
| JP | 2005-254481 | 9/2005 |
| KR | 10-1695416 | 1/2017 |
| KR | 10-2017-0019251 A | 2/2017 |
| KR | 10-2017-0071815 A | 6/2017 |

OTHER PUBLICATIONS

Yue, Naili et al., "A Novel Method to Enable Laser Welding of Liquid Crystal Polymer Metal Laser Mask Technique", www.microvision.com, May 10, 2017.
Microvision, Inc., , "International Search Report and Written Opinion", dated Mar. 28, 2019.
Microvision, Inc., "International Search Report and Written Opinion", dated Apr. 1, 2019.

* cited by examiner

*Primary Examiner* — Daniel McNally
(74) *Attorney, Agent, or Firm* — Kevin D. Wills

(57) ABSTRACT

The embodiments described herein provide improved techniques for laser welding. These techniques can provide improved weld strength while reducing the potential for damage at the welding surface. In general, the techniques use a mask to selectively block a portion of the laser beam during welding. Specifically, the mask is made to include at least one laser light blocking feature and at least one laser light passing feature. The mask is positioned to be in contact with the plastic bodies that are to be welded together, with the laser light blocking feature and laser light passing feature proximate to the area that is to be welded. Then during welding the laser beam is operated to simultaneously impact the laser light blocking feature and pass through the laser light passing feature.

20 Claims, 7 Drawing Sheets

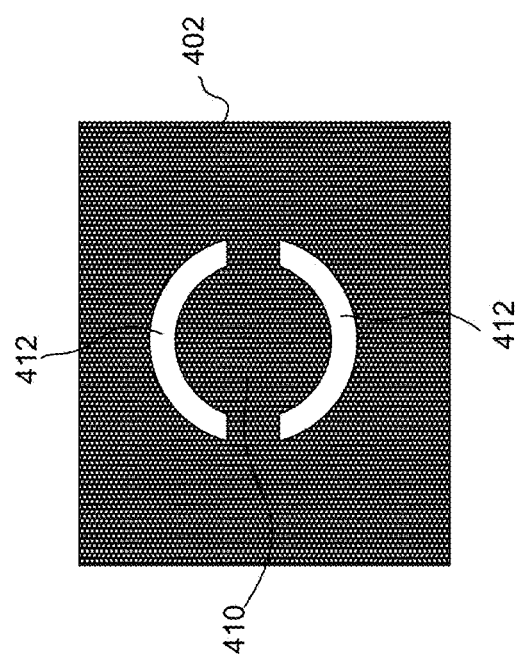
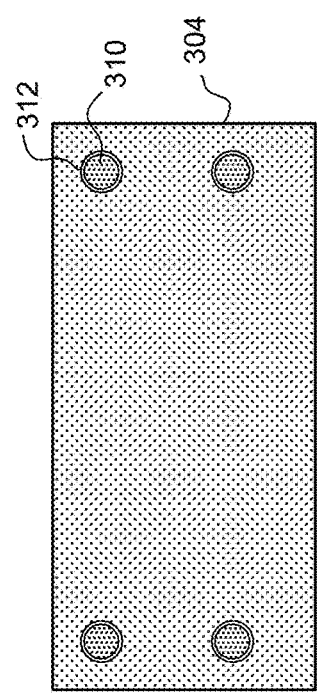
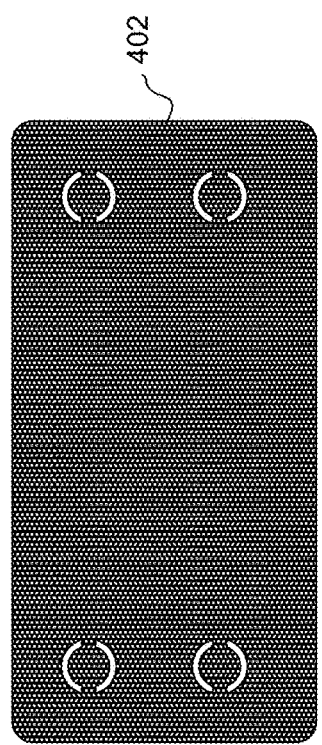
FIG. 4A
FIG. 4B
FIG. 4C

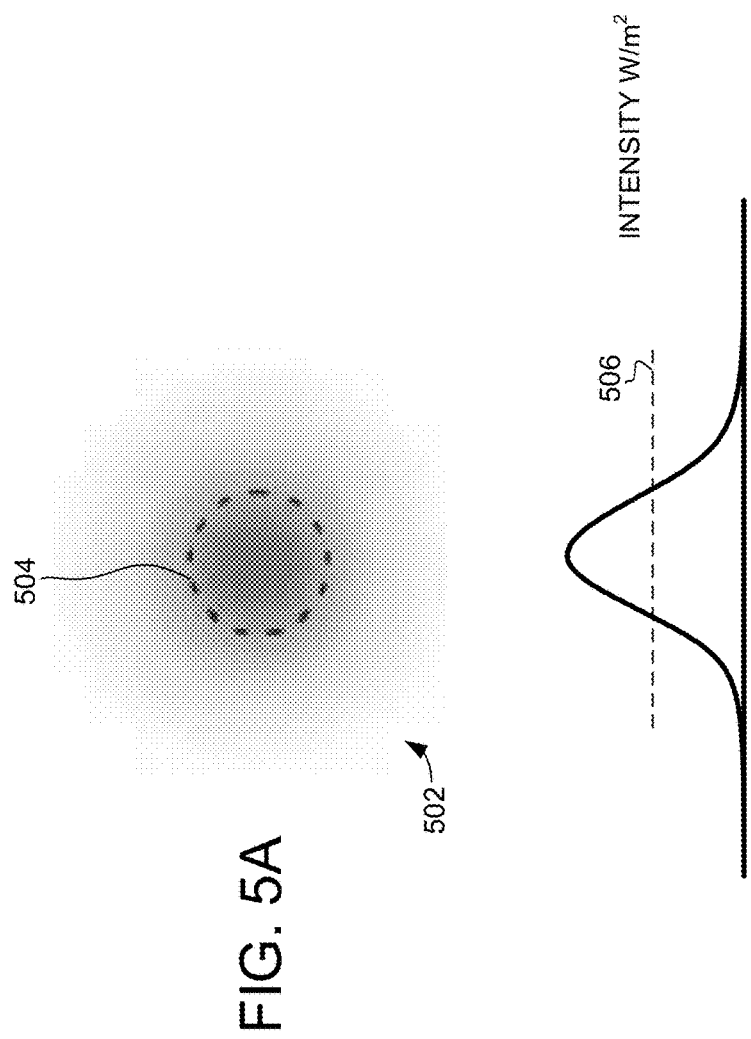

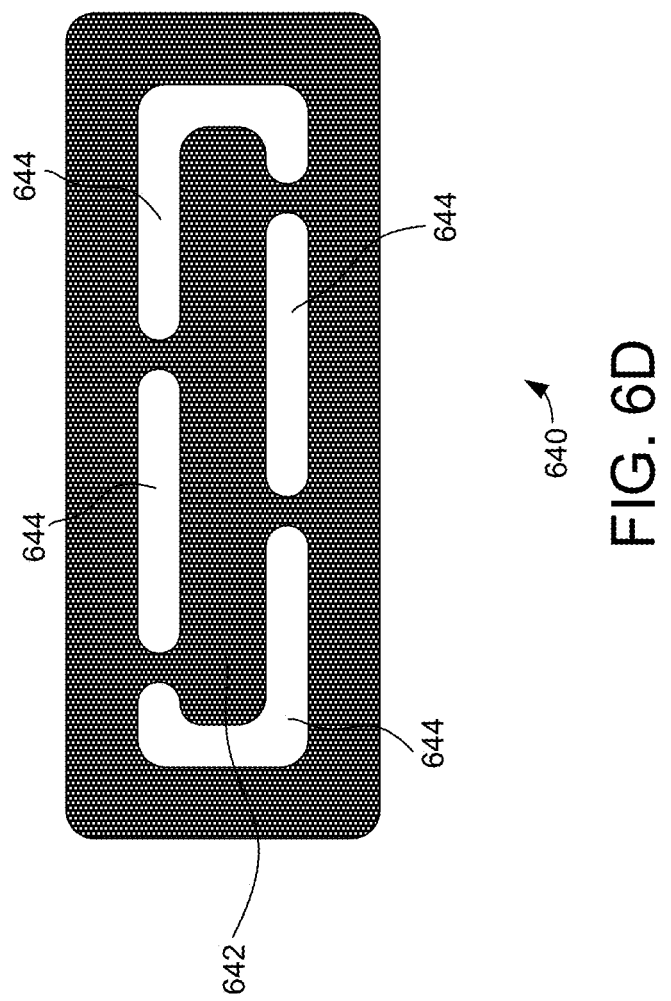

PLASTIC LASER WELDING WITH PARTIAL MASKING

RELATED APPLICATIONS

This application is related to the application entitled "Laser Welded Scanner Assemblies" filed on Dec. 19, 2017 with the application Ser. No. 15/846,747 and assigned to the same assignee.

FIELD

The present disclosure generally relates to laser welding, and more particularly relates to laser welding of plastics.

BACKGROUND

Laser welding has been commonly used to permanently join devices made with plastic. For example, laser welding is commonly used to join together separate plastic bodies to make a larger overall device. One type of laser welding is laser transmission welding (LTW). In laser transmission welding the laser beam passes through a first plastic body and welds at the interface with second plastic body. As such, laser transmission welding requires that the first plastic body be transmissive to the laser beam. This is a significant limitation on the type of plastics that can be used and the location of the welds.

Another type of laser welding is laser absorption welding (LAW). In laser absorption welding both plastic bodies are directly exposed to the laser. Thus, laser absorption welding does not require the use of transmissive plastic to facilitate welding. However, because the laser absorption welding is performed directly on exposed surfaces the technique can cause excessive evaporation and oxidation of the plastic where the laser impacts the surfaces. The damage caused by evaporation and oxidation can be reduced by limiting the power of the laser, but such a reduction in power can also result in reduced welding depth and insufficient bond strength.

Thus, there is a continuing need for improved techniques for laser welding of plastics that can provide improved bond strength while reducing the potential for damage to the surfaces the devices being welded.

BRIEF DESCRIPTION OF THE DRAWINGS

FIGS. 4A, 4B, and 4C are top views of a first body with a second body, a mask, and an enlarged view of the mask in accordance with an embodiment of the present invention;

FIGS. 5A and 5B are diagrams illustrating laser intensity in accordance with various embodiments of the present invention; and FIGS. 6A, 6B, 6C, and 6D are partial views of exemplary masks in accordance with various embodiments of the present invention.

DESCRIPTION OF EMBODIMENTS

The embodiments described herein provide improved techniques for laser welding. These techniques can provide improved weld strength while reducing the potential for damage at the welding surface.

In general, the techniques use a mask to selectively block a portion of the laser beam during welding. Specifically, the mask is made to include at least one laser light blocking feature and at least one laser light passing feature. The mask is positioned to be in contact with the plastic bodies that are to be welded together, with the laser light blocking feature and laser light passing feature proximate to the area that is to be welded. Then during welding the laser beam is operated to simultaneously impact the laser light blocking feature and pass through the laser light passing feature. The portion of the laser beam hitting the blocking feature causes the underlying plastic body to heat through conduction, while the portion of the laser beam passing through the laser light passing feature impacts and directly heats the underlying plastic body. This combination of simultaneously heating the plastic bodies through conduction and direct impact of the laser melts the plastic bodies to weld the two bodies together.

This technique can result in a weld between the plastic bodies with increased bond strength, while also reducing the potential for damage on the welded surface. For example, this technique can allow for increased welding depth and/or reduced evaporation and oxidation of material at the surface of the plastic bodies. Increasing the welding depth can result in increased bonding strength, and thus this technique can be used to weld bodies together that are subject to significant separation forces during use. Furthermore, this technique does not require the use of plastic that is transmissive to the welding laser. Thus, in some embodiments both of the plastic bodies can be made of plastics that are opaque to and thus absorb the welding laser.

Figure 1:
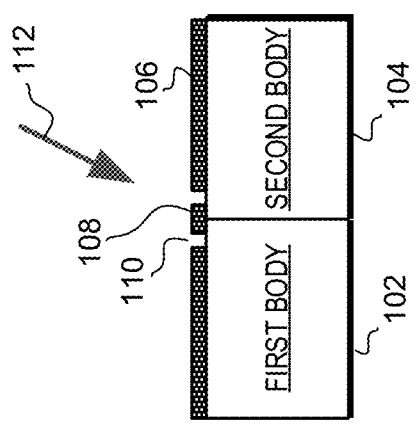
FIG. 1 shows a schematic diagram of an exemplary welding technique in accordance with various embodiments of the present invention.

Turning now to FIG. 1, an example technique of welding of plastic bodies is illustrated schematically. Specifically, FIG. 1 illustrates a first body 102, a second body 104 and a mask 106. In accordance with the embodiments described herein, the mask 106 includes at least one laser light blocking feature 108 and at least one laser light passing feature 110. The mask 106 is positioned to be in contact with the plastic bodies 102 and 104 that are to be welded together, with the laser light blocking feature 108 and laser light passing feature 110 proximate to the specific area that is to be welded. The laser beam 112 is then operated to simultaneously impact the laser light blocking feature 108 and pass through the laser light passing feature 110. The portion of the laser beam hitting and be absorbed by the blocking feature 108 heats the blocking feature 108. The heat in the blocking feature 108 spreads by conduction to the underlying plastic bodies 102 and 104. At the same time, the portion of the laser beam passing through the laser light passing feature impacts and directly heats the underlying plastic bodies 102 and 104. This combination of simultaneously heating the plastic bodies 102 and 104 through conduction and direct impact of the laser melts the plastic and results in a portion of the two plastic bodies 102 and 104 melting and thus being welded together.

The welding technique illustrated in FIG. 1 can provide welds with increased bond strength by increasing the depth of that can be welded without incurring unacceptable levels of damage to the surfaces of the plastic bodies 102 and 104. Specifically, because the mask 106 blocks at least a portion of the laser beam 112 from directly impacting the plastic bodies 102 and 104 the evaporation of light-elements including hydrogen, oxygen and nitrogen from the surface of the plastic bodies 102 and 104 is reduced. Furthermore, the carbonation at the surface that can result from overheating the plastic can also be reduced. This reduction in damage at the surface of the bodies 102 and 104 can facilitate increased weld depth by allowing the welding to continue for a longer time period. And as noted above, increasing the welding depth can result in increased bonding strength.

The techniques described herein can be implemented using a wide variety of devices, materials and structures. For example, these welding techniques can use a variety of different types of lasers. For example, lasers that generate laser beams having wavelengths between 300 nm and 1200 nm can be used in some applications. In more specific examples, infrared lasers can be used. For example, infrared lasers having wavelengths between 700 nm and 900 nm can be used. As one specific example, a semiconductor infrared laser having a wavelength of 808 nm and 30 W of power can be used. Such a procedure can be used to achieve a weld depth of greater than 0.20 mm, and more precisely between 0.20 mm and 0.27 mm in certain configurations.

The welding techniques described herein can be applied to a variety of plastics, including both liquid crystal polymers and amorphous polymers. As specific examples, Vectra® A115 and A130 can be used for some applications.

Likewise, the mask 106 used in these techniques can be made from a variety of materials. For example, the mask 106 can be formed from a variety of metals. These metals can provide relatively high rate of heat conduction to the underlying plastic. Examples of such metals include titanium, tungsten, and copper. In each case the mask 106 can comprise any suitable alloy or other combination of metals. As one specific example, titanium Ti-6Al-4V can be used. In other examples the mask 106 can be fabricated from a suitable glass or crystalline material with a suitably high melting point.

The laser light blocking feature 108 and laser light passing feature 110 can likewise be implemented in a variety structures. For example, in one embodiment the laser light passing feature 110 is implemented as an opening that is adjacent to the blocking feature 108. In other embodiments the laser light passing feature 110 is fabricated from a material that is at least partially transmissive to the laser beam used for welding. For example, the laser light passing feature can be implemented with a high melting point glass material.

The laser light blocking feature 108 and laser light passing feature 110 can likewise be implemented in a variety shapes. In a typical embodiment the shape of these features would be optimized for the structure and shape of the underlying plastic bodies 102 and 104 being welded.

As one specific example, the blocking feature 108 can be implemented to have a substantially circular shape, while the passing feature 110 is implemented to have an at least partially annular shape that surrounds the circular shape. Such an embodiment can be useful in the welding of post/hole structures. In these cases the circular shape of the blocking feature 108 can have a diameter that at least nearly corresponds with the diameter of the post structure to be welded. Likewise, the annular shape of the passing structure 110 can correspond to the plastic body defining the hole that receives the post. Detailed examples of such a mask and post/hole structure will be discussed in greater detail below with reference to FIGS. 3 and 4.

In other examples the blocking feature 108 and passing feature 110 can have rectangular or rectangular-like shapes. Furthermore, these features can also include various bends and curves as desirable for a particular application. Again, in each of these cases the shape of the blocking feature 108 and passing feature 110 can be optimized for the structure being welded.

Finally, in some implementations the size and shape of the blocking feature 108 and passing feature 110 are made to correspond to the beam diameter of the welding laser. In such an embodiment the center of the laser beam can be directed to the blocking feature 108 such a majority portion of the laser beam energy is directed into the blocking feature 108, while a minority portion of the laser beam energy passes through the passing feature 110. A detailed example of such a feature will be discussed in greater detail below with reference to FIGS. 5A and 5B.

Figure 2:
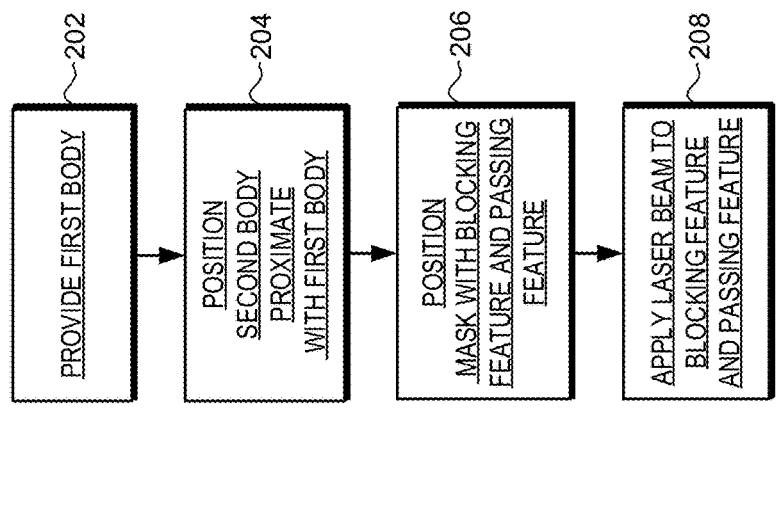
FIG. 2 is a flow diagram of an exemplary welding method in accordance with various embodiments of the present invention.

Turning now to FIG. 2, an exemplary method of welding 200 is illustrated in a flow diagram. It should be noted that while the method 200 is illustrated with the various steps performed in one order, that these steps can in many cases be performed in a variety of orders.

The first step 202 in method 200 is to provide a first body. A described above, the first body can comprise any suitable plastic body that is to be welded, including bodies formed from liquid crystal polymers and/or amorphous polymers or other plastics capable of absorbing laser light. Furthermore, such a body can include a variety of features, including non-plastic features such as encapsulated metallic structures and other devices.

The next step 204 is to position a second body to be proximate with the first body. Again, the second body can comprise any suitable plastic body that is to be welded, and can include a variety of features and structures. In some embodiments the first body and second body can include coupling structures, and in these embodiments the positioning of the bodies proximate each other can include the coupling together of these structures. As one specific example, the positioning of the second body proximate to the first body can include positioning one or more coupling posts into corresponding holes.

The next step 206 is to position a mask having a blocking feature and a passing feature. In this step the mask is positioned such that at least the blocking feature is in contact with one of the bodies in an area proximate to a region that is to be welded. For example, the mask can be positioned such that the blocking feature is in contact with a coupling structure that is to be welded. As one specific example, the blocking feature can be positioned to at least partially cover a post used in a post/hole coupling structure.

The next step 208 is to apply a laser beam to the blocking feature and passing feature. This causes the laser beam to both impact the blocking feature and pass through the laser light passing feature. A first portion of the laser beam impacts and is absorbed by the blocking feature. This heats the blocking feature, and the heat spreads by conduction to body in contact with the blocking feature. At the same time, a second portion of the laser beam passing through the laser light passing feature impacts and directly heats the underlying body. This combination of simultaneously heating by conduction and direct impact melts the plastic and welds the bodies together.

In should be noted that having the blocking feature in contact with the disc can also apply pressure to the post. This pressure can deform the post during welding and further improve the bonding strength by reducing space between the post and hole.

Figure 3:
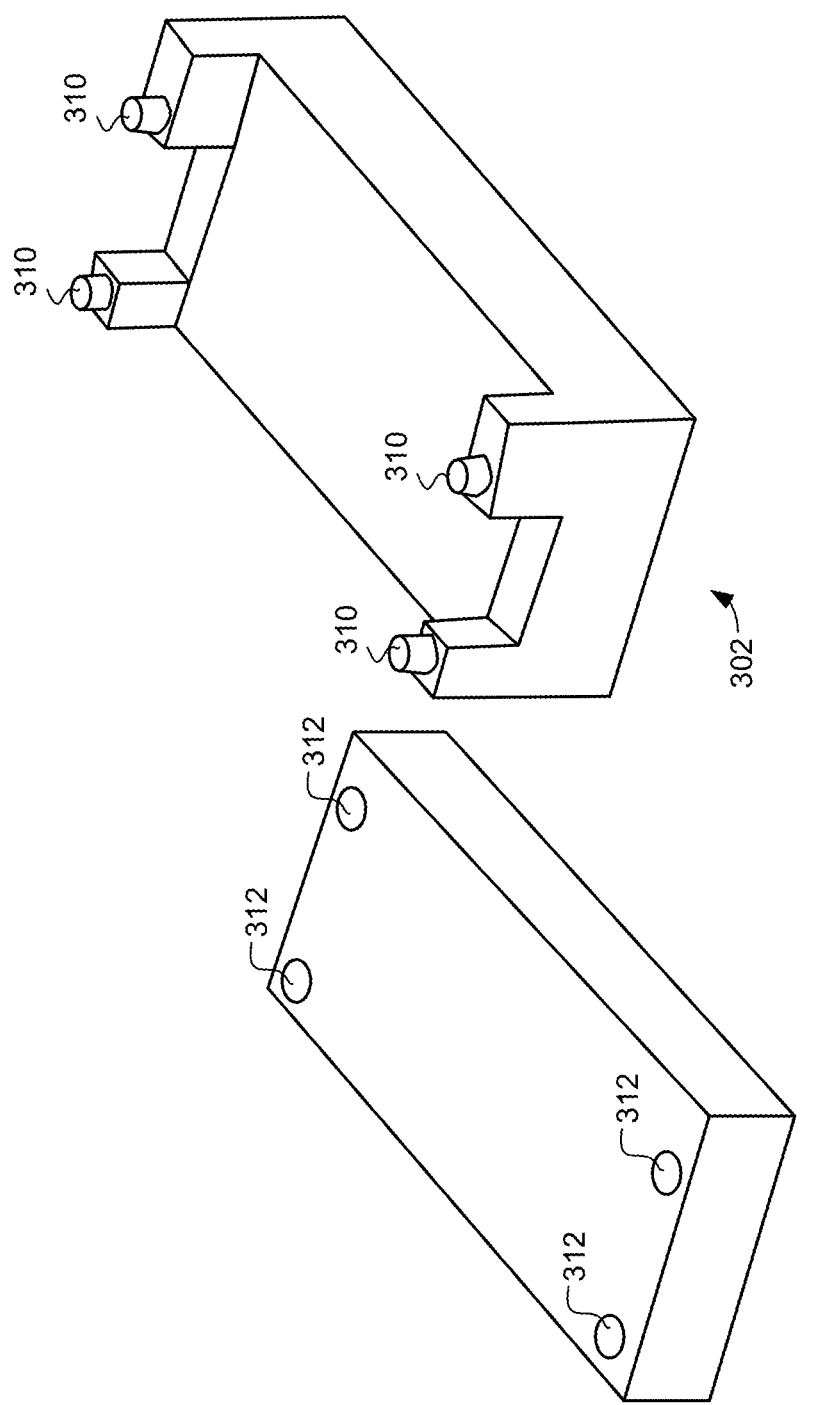
FIG. 3 is a perspective view of an exemplary first body and second body in accordance with an embodiment of the present invention.

Turning now to FIG. 3, an exemplary first body 302 and second body 304 are illustrated schematically. As was the described above the first body 302 and second body 304 can comprise any suitable plastic material, including liquid crystal polymers and/or amorphous polymers. In the example of FIG. 3 the first body 302 and the second body 304 are configured to be coupled together and welded. Specifically, the first body 302 includes four posts 310, and the second body 304 includes four corresponding holes 312. The holes 312 are arranged and configured to receive the corresponding posts 310 when the first body 302 is coupled to the second body 304. The posts 310 and holes 312 can then be welded together to provide a permanent coupling of the first body 302 to the second body 304.

The bodies 302 and 304 can include a variety of features not shown in FIG. 3. For example, the bodies 302 can be formed to include non-plastic features such as encapsulated metallic structures and other devices. In one specific embodiment, the bodies 302 and 304 can be configured to at least partially encase a scanning mirror. For example, the bodies 302 and 304 can be configured to encase a microelectromechanical (MEMS) scanning mirror used in laser scanning devices. In such a case the bodies 302 and 304 can include one or more magnets that apply significant separation forces to the bodies 302 and 304. The presence of these magnets and the resulting separation forces provides the need for relatively strong welds to bind first body 302 to second body 304.

In accordance with the embodiments described herein such relatively strong welds can be provided by welding through a mask that includes one or more blocking features and one or more passing features. Turning now to FIG. 4A, a top view of the first body 302 and the second body 304 is illustrated. In this figure the two bodies 302 and 304 are coupled together such that each of the four posts 310 is in a corresponding hole 312. As such, the first body 302 and the second body 304 are in position to be welded.

FIG. 4B illustrates a top view of an exemplary mask 402. The mask includes a plurality of blocking features 410 and a plurality of passing features 412. The configuration and arrangement of the blocking features 410 and the passing features 412 correspond to the arrangement of the posts 310 and the holes 312 in the bodies 302 and 304. Thus, the mask 402 can be positioned such that the each of blocking features 410 and passing features 412 are each proximate to a corresponding post 310 and hole 312. This allows for the posts 310 and holes 312 to be welded together by applying a laser beam to the blocking features 410 and the passing features 412.

Specifically, for each post 310/hole 312 combination, a laser beam is applied such that a first portion of the laser beam impacts and is absorbed by the blocking feature 410 while a second portion of the laser beam passes through the passing feature 412. The first portion of the laser beam heats the blocking feature 410, and the heat spreads by conduction to the underlying post 310. At the same time, the second portion of the laser beam passes through the passing features 412 and impacts the exposed region of the second body 304 surrounding the hole 312. This combination of simultaneously heating the post 310 by conduction and heating the exposed regions around the hole 312 by direct impact of the laser melts the plastic and welds the post 310 and hole 310 together.

Turning now to FIG. 4C, an expanded view of one blocking feature 410 and two passing features 412 is illustrated. As can be more clearly seen in this expanded view, the blocking feature 410 has a partially circular shape. Likewise, the passing features 412 each have a partially annular shape that surrounds the partially circular shape. These shapes correspond to the shapes of the underlying post 310/hole 312 combination. Thus, the circular shape can at least substantially cover the underlying post 310, while the annular shape exposes a region around the hole 312. Thus, in a typical embodiment the circular shape would have a diameter that corresponds to the diameter of the underlying post 310.

In some embodiments it may also be desirable to correlate the intensity of the welding laser beam to the size of the blocking feature 410 and/or post 310. Turning now to FIG. 5A, a cross sectional view of intensity in an exemplary laser beam 502 is illustrated. In FIG. 5A the intensity of the laser beam 502 is illustrated in grey scale, with darker areas having more intensity than lighter areas. A corresponding profile of the laser energy density is illustrated in FIG. 5B, with the intensity illustrated in the units of watts per meter squared ($W/m^2$). As can be seen in these FIGS., the intensity of the laser follows a Gaussian distribution that is greatest near the center of the beam and drops off exponentially as distance from the center of the beam increases.

In some embodiments it can be desirable to correlate the size of the blocking feature and/or passing feature with the intensity profile of the welding laser beam. Likewise, the size of the coupling features (e.g., post and hole) can also be correlated to the size intensity profile of the laser beam.

As one specific example, the circular shape of the blocking feature 410 can have a diameter between 0.55 mm and 0.65 mm. Likewise, the annular shape of the passing features can have collective outer diameter between 0.85 mm and 0.95 mm. In such an example the laser beam used for welding may have a beam diameter of between 0.5 mm and 0.7 mm.

In the example of FIGS. 5A and 5B, the circle 504 and line 506 indicate the where the intensity of the laser drops below ~60-80% of the maximum intensity. As one example embodiment, the laser beam can be configured (and/the blocking feature sized) such that the portion of the laser beam in the center and above the intensity levels indicated by circle 504 and line 606 strike the blocking feature, while a portion of the laser beam below that intensity level can pass through the passing feature and impact the underlying plastic body. Thus, in such a configuration the plastic body is protected in part from the highest intensity regions of the laser beam, and thus damage to the surface that would otherwise be caused by that high intensity can be reduced.

Furthermore, in some lasers the intensity profile is less homogenous in the center of the laser and in such an embodiment the blocking feature can additionally serve to homogenize the energy that is applied to the plastic body in the corresponding region.

It should be noted that the example illustrated in FIGS. 5A and 5B is just one example, and that other laser intensity profiles and relative sizes of features can be used.

Figure 6C:
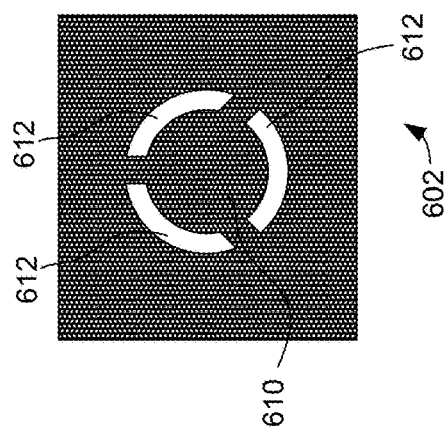

It should again be noted that the example of FIG. 4C is just one example of how the blocking features and passing features can be implemented. Turning now to FIG. 6A, another expanded view of an exemplary mask portion 602 is illustrated. The mask portion 602 includes a blocking feature 610 and three passing features 612. Like the example of FIG. 4C, the blocking feature 610 has a partially circular shape, and the passing features 612 each have a partially annular shape that surrounds the partially circular shape. However, in this case there are three passing features 612 and thus three connections between the mask portion 602 and the blocking feature 610. Again, in some embodiments these shapes would be configured to correspond to the shapes of the underlying features that are to be welded.

Figure 6B:
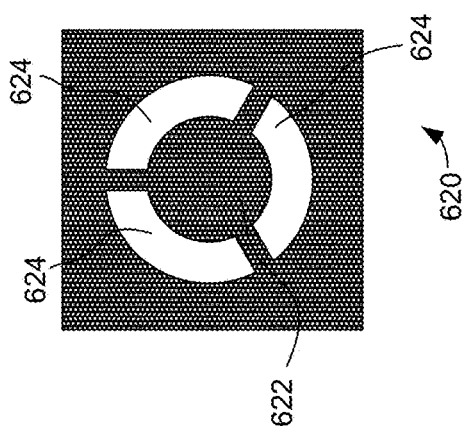
Figure 6A:
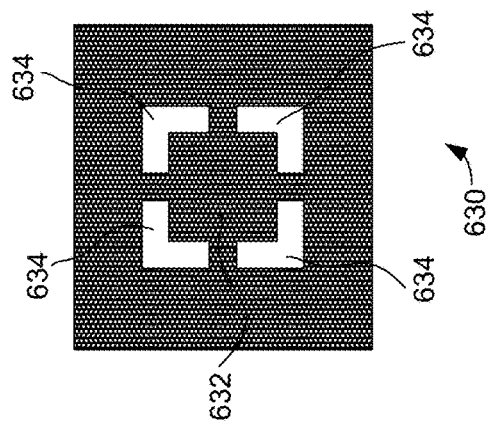

Turning now to FIG. 6B, another expanded view of an exemplary mask portion 620 is illustrated. The mask portion 620 includes a blocking feature 622 and three passing features 624. Like the example of FIG. 6A, the blocking feature 622 has a partially circular shape, and the passing features 624 each have a partially annular shape that surround the partially circular shape. However, in this case passing features 624 are relatively large, and thus more laser light would be allowed to directly impact the underlying body.

Turning now to FIG. 6C, another expanded view of an exemplary mask portion 630 is illustrated. The mask portion 630 includes a blocking feature 632 and four passing features 634. In this example the blocking feature 632 has a partially square shape, and the passing features 634 each have a corner shapes that in part surround the partially square shape.

Turning now to FIG. 6D, another expanded view of an exemplary mask portion 640 is illustrated. The mask portion 640 includes a blocking feature 642 and four passing features 644. In this example the blocking feature 642 has a partially rectangular shape, and the passing features 644 have various different shapes that together partially surround the blocking feature 642.

Again, the mask portions illustrated in FIGS. 6A, 6B, 6C, and 6D are just some of the shapes and structures that can be implemented and used. For example, various configurations of curved, bent, and irregular shapes can be used. In each of these embodiments the shape can be configured to follow the weld line of the laser.

It should be noted that the welding procedures described herein can provide a high strength bond relatively quickly. Thus, such a welding procedure can reduce or even eliminate the need for special clamping and other time consuming procedures that could be required when using other bonding techniques. Presently, adhesive bonding is a major method to join two pieces of plastics. One issue with adhesive bonding is the need for clamping pieces together while the adhesive drives. The laser welding procedure described herein can eliminate the need for clamping that could otherwise be required to hold the plastic bodies together while an adhesive dries. This reduction in the need for clamping and in the time needed to form the bond can greatly simplifying the manufacturing process, and thus can increase yield and reduce costs.

Furthermore, the use of adhesives can provide limited bonding strength due to the weak skin effects in plastics that can potentially lead to separation of the two mating plastics. The use of the laser welding procedure can avoid these weak skin effects and thus provide a stronger bond between bodies. This stronger bond adds strength over life and thus can improve the long term reliability and longevity of the welded device. Furthermore, this technique can result in a weld between the plastic bodies with increased bond strength, while also reducing the potential for damage on the welded surface. For example, this technique can allow for increased welding depth and/or reduced evaporation and oxidation of material at the surface of the plastic bodies. Increasing the welding depth can result in increased bonding strength, and thus this technique can be used to weld bodies together that are subject to significant separation forces during use.

Furthermore, this technique does not require the use of plastic that is transmissive to the welding laser. Thus, in some embodiments both of the plastic bodies can be made of plastics that are opaque to and thus absorb the welding laser. The ability to use opaque plastics can facilitate the use of stronger plastics. Specifically, plastics can be made stronger by reinforcing the plastic with a certain percentage of particulate like carbon or fiber like silica (SiO2). However the addition of these extra reinforcements reduces plastic's transmission to light, limiting the ability to use these reinforced plastics in transmission laser welding. Thus, the embodiments described herein can facilitate the use of higher strength reinforced plastics by facilitating the use of absorption laser welding.

As one example implementation, a post-hole coupling feature made from liquid crystal polymer having a shear strength of 5.935 kgf/mm$^2$ and having a post radius of 0.3 mm can be welded through a mask using an infrared laser of 808 mm. Such a configuration can result in a welding depth of 0.27 mm without causing excessive damage to the surface. At this welding depth the welded bond can withstand a shear force of 3.02 kgf. In contrast, without the mask the welding depth would be limited to 0.12 mm, and thus would only provide the ability to withstand a shear force of 1.22 kgf. Thus, in this embodiment the use of the laser mask is able to more than double the strength of the bond created by laser welding.

In one embodiment, a method of laser welding is provided, the method comprising: providing a first body, the first body comprising a first plastic material capable of absorbing laser light; positioning a second body proximate to the first body, the second body comprising a second plastic material capable of absorbing laser light; positioning a mask in contact with the first body, the mask including at least one laser light blocking feature and at least one laser light passing feature; and applying a laser beam to the light blocking feature and-light passing feature to weld the first body to the second body.

In another embodiment, a method of laser welding is provided, the method comprising: providing a first body, the first body comprising a first polymer capable of absorbing laser light having a wavelength between 300 nm and 1200 nm; positioning a second body in proximate to the first body, the second body comprising a second polymer capable of absorbing laser light having a wavelength 300 nm and 1200 nm; positioning a mask in contact with the first body, the mask including a laser light blocking feature and a laser light passing feature adjacent to the laser light blocking feature; and applying a laser beam having a wavelength between 300 nm and 1200 nm to the laser light blocking feature and the laser light passing feature such that laser beam impacts the laser light blocking feature and heats the first body through conduction and such that the laser beam simultaneously passes through the laser light passing feature to heat the second body directly to weld the first body to the second body.

In another embodiment, a method of laser welding is provided, the method comprising: providing a first body, the first body including a circular post, the first body comprising a first liquid crystal polymer material capable of absorbing infrared laser light having a wavelength between 700 nm and 900 nm; providing a second body, the second body including a circular hole configured to receive the circular post, the second body comprising a second liquid crystal polymer material capable of absorbing infrared laser light having a wavelength between 700 nm and 900 nm; positioning the first body and the second body such that the hole receives the post; providing a mask having a blocking feature and a non-blocking feature; positioning the mask such that the blocking feature covers and contacts at least a portion of the post while the non-blocking feature exposes a portion of the second body surrounding the hole; and applying a laser beam having a wavelength between 700 nm and 900 nm to the blocking feature and non-blocking feature such that laser beam impacts the blocking feature and heats the post through conduction and such that the laser beam simultaneously passes through the non-blocking feature to the portion of the second body surrounding the hole directly to weld the post to the portion of the second body surrounding the hole.

In the preceding detailed description, reference was made to the accompanying drawings that show, by way of illustration, specific embodiments in which the invention may be practiced. These embodiments were described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The preceding detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. A method of laser welding, the method comprising:
   providing a first body, the first body comprising a first plastic material capable of absorbing laser light;
   positioning a second body proximate to the first body, the second body comprising a second plastic material capable of absorbing laser light;
   positioning a mask in contact with the first body, the mask including at least one laser light blocking feature and at least one laser light passing feature; and
   applying a laser beam to the light blocking feature and light passing feature to weld the first body to the second body such that the laser beam impacts the laser light blocking feature and heats the first body through conduction and such that the laser beam passes through the laser light passing feature to heat the second body directly to weld the first body to the second body.

2. The method of claim 1, wherein the laser light blocking feature has at least a partially circular shape and wherein the laser light passing feature has at least a partially annular shape surrounding the circular shape.

3. The method of claim 2, wherein the circular shape has a diameter between 0.55 mm and 0.65 mm and wherein the annular shape as an outer diameter between 0.85 mm and 0.95 mm.

4. The method of claim 1, wherein the first plastic material and the second plastic material comprise at least one of a liquid crystal polymer and an amorphous polymer.

5. The method of claim 1, wherein the mask comprises a metallic material.

6. The method of claim 1, wherein the laser light passing feature comprises an opening adjacent to the laser light blocking feature.

7. The method of claim 1, wherein the laser light passing feature comprises a material at least partially transmissive to the laser beam in an infrared spectrum.

8. The method of claim 1, wherein the laser beam has a beam diameter between 0.5 mm and 0.7 mm.

9. The method of claim 1, wherein the laser beam has a wavelength between 300 nm and 1200 nm.

10. The method of claim 1, wherein the positioning the mask in contact with the first body comprises positioning the laser light blocking feature to be in contact with the first body.

11. The method of claim 1, wherein the laser light blocking feature has at least a partially rectangular shape.

12. The method of claim 1, wherein the first body includes a post and wherein the second body includes a hole configured to receive the post, and wherein the step of applying the laser beam is such that the laser beam impacts the laser light blocking feature and heats the post through conduction and such that the laser beam passes through the laser light passing feature to heat a portion of the second body surrounding the hole directly to weld the first body to the second body.

13. A method of laser welding, the method comprising:
    providing a first body, the first body comprising a first polymer capable of absorbing laser light having a wavelength between 300 nm and 1200 nm, and wherein the first body includes a post;
    positioning a second body in proximate to the first body, the second body comprising a second polymer capable of absorbing laser light having a wavelength 300 nm and 1200 nm, and wherein the second body includes a hole configured to receive the post;
    positioning a mask in contact with the first body, the mask including a laser light blocking feature and a laser light passing feature adjacent to the laser light blocking feature; and
    applying a laser beam having a wavelength between 300 nm and 1200 nm to the laser light blocking feature and the laser light passing feature such that the laser beam impacts the laser light blocking feature and heats the first body through conduction and such that the laser beam simultaneously passes through the laser light passing feature to heat the second body directly to weld the first body to the second body.

14. The method of claim 13, wherein the laser light blocking feature has at least a partially circular shape and wherein the laser light passing feature has at least a partially annular shape surrounding the circular shape, and wherein the step of positioning the mask in contact with the first body and the second body comprises positioning the circular shape of the blocking feature to be in contact with the post.

15. The method of claim 14, wherein the post has a diameter between 0.55 mm and 0.65 mm, and wherein the circular shape has a diameter between 0.55 mm and 0.65 mm and wherein the annular shape has an outer diameter between 0.85 mm and 0.95 mm.

16. The method of claim 15, wherein the laser beam comprises an infrared laser beam having a beam diameter between 0.5 mm and 0.7 mm.

17. The method of claim 15, wherein the first body and the second body comprise reinforcing particulate such that the first body and the second plastic absorb the laser beam.

18. The method of claim 13, wherein the first polymer and the second polymer comprise at least one of liquid crystal polymer and amorphous polymer.

19. The method of claim 13, wherein the mask comprises a metallic material.

20. A method of laser welding, the method comprising:
providing a first body, the first body including a circular post, the first body comprising a first liquid crystal polymer material capable of absorbing infrared laser light having a wavelength between 700 nm and 900 nm;
providing a second body, the second body including a circular hole configured to receive the circular post, the second body comprising a second liquid crystal polymer material capable of absorbing infrared laser light having a wavelength between 700 nm and 900 nm;
positioning the first body and the second body such that the hole receives the post;
providing a mask having a blocking feature and a non-blocking feature;
positioning the mask such that the blocking feature covers and contacts at least a portion of the post while the non-blocking feature exposes a portion of the second body surrounding the hole; and
applying a laser beam having a wavelength between 700 nm and 900 nm to the blocking feature and non-blocking feature such that the laser beam impacts the blocking feature and heats the post through conduction and such that the laser beam simultaneously passes through the non-blocking feature to the portion of the second body surrounding the hole directly to weld the post to the portion of the second body surrounding the hole.

* * * * *